US008260593B2

(12) United States Patent
Raschke

(10) Patent No.: US 8,260,593 B2
(45) Date of Patent: Sep. 4, 2012

(54) SYSTEM AND METHOD FOR SIMULATING HUMAN MOVEMENT

(75) Inventor: Ulrich Raschke, Ann Arbor, MI (US)

(73) Assignee: Siemens Product Lifecycle Management Software Inc., Plano, TX (US)

( * ) Notice: Subject to any disclaimer, the term of this patent is extended or adjusted under 35 U.S.C. 154(b) by 2017 days.

(21) Appl. No.: 10/246,880

(22) Filed: Sep. 18, 2002

(65) Prior Publication Data

US 2004/0054510 A1   Mar. 18, 2004

(51) Int. Cl.
  G06G 7/48 (2006.01)
  G06T 15/00 (2006.01)
  G06T 17/00 (2006.01)
(52) U.S. Cl. ............ 703/7; 345/419; 345/420; 345/951; 345/952
(58) Field of Classification Search ...... 703/7; 345/420, 345/419, 951, 952
See application file for complete search history.

(56) References Cited

U.S. PATENT DOCUMENTS

| | | | | |
|---|---|---|---|---|
| 5,253,189 A * | 10/1993 | Kramer | ......... | 703/7 |
| 5,623,428 A * | 4/1997 | Kunii et al. | ......... | 703/6 |
| 5,625,577 A | 4/1997 | Kunii et al. | ......... | 364/578 |
| 5,835,693 A * | 11/1998 | Lynch et al. | ......... | 345/473 |
| 5,867,631 A * | 2/1999 | Sato et al. | ......... | 700/262 |
| 5,905,658 A * | 5/1999 | Baba | ......... | 703/7 |
| 5,982,389 A | 11/1999 | Guenter et al. | ......... | 345/474 |
| 5,989,157 A * | 11/1999 | Walton | ......... | 482/4 |
| 6,005,548 A * | 12/1999 | Latypov et al. | ......... | 345/156 |
| 6,057,859 A * | 5/2000 | Handelman et al. | ......... | 345/474 |
| 6,088,042 A * | 7/2000 | Handelman et al. | ......... | 345/473 |
| 6,161,080 A * | 12/2000 | Aouni-Ateshian et al. | ..... | 703/11 |
| 6,243,106 B1 * | 6/2001 | Rehg et al. | ......... | 345/473 |
| 6,462,742 B1 * | 10/2002 | Rose et al. | ......... | 345/473 |
| 6,651,044 B1 * | 11/2003 | Stoneman | ......... | 706/10 |
| 6,690,999 B2 * | 2/2004 | Kimura | ......... | 700/245 |
| 6,694,044 B1 * | 2/2004 | Pavlovic et al. | ......... | 382/107 |
| 6,738,065 B1 * | 5/2004 | Even-Zohar | ......... | 345/473 |
| 2003/0018412 A1 * | 1/2003 | Kimura | ......... | 700/245 |
| 2003/0083596 A1 * | 5/2003 | Kramer et al. | ......... | 600/595 |
| 2003/0215130 A1 * | 11/2003 | Nakamura et al. | ......... | 382/154 |

(Continued)

FOREIGN PATENT DOCUMENTS

EP         0 858 201 A2     8/1998

(Continued)

OTHER PUBLICATIONS

"Interpolation synthesis of articulated figure motion"; Wiley, D.J.; Hahn, J.K.; Computer Graphics and Applications, IEEE vol. 17, Issue 6, Nov.-Dec. 1997 pp. 39-45.*

(Continued)

Primary Examiner — David Silver
Assistant Examiner — Akash Saxena

(57) ABSTRACT

According to one embodiment of the invention, a computerized method for simulating human movement includes storing a plurality of sets of data, in which each set of data is indicative of a measured movement of a first human, receiving a start point and an end point for a desired movement of a second human, and comparing the desired movement to the stored sets of data. The method further includes selecting, based on the comparison, a stored set of data that is representative of the desired movement and simulating the desired movement based on the start point, the end point, and the relative change in position of a first joint associated with the selected set of data from an empirical start point to an empirical end point.

22 Claims, 2 Drawing Sheets

U.S. PATENT DOCUMENTS

| | | | |
|---|---|---|---|
| 2004/0012593 A1 | 1/2004 | Lanciault | 345/473 |
| 2004/0054510 A1 | 3/2004 | Raschke | 703/6 |
| 2005/0107916 A1* | 5/2005 | Nagasaka | 700/245 |

FOREIGN PATENT DOCUMENTS

| | | |
|---|---|---|
| EP | 1 130 875 A2 | 9/2001 |
| WO | WO 96/18253 | 6/1996 |
| WO | WO 00/16206 | 3/2000 |

OTHER PUBLICATIONS

"Model predictive control of human elbow joint movement";Xingfei Li et al; Engineering in Medicine and Biology Society, 1998. Proceedings of the 20th Annual Intnl Conference of the IEEE; vol. 5, Oct. 29-Nov. 1, 1998 pp. 2366-2369 vol.*

"Inverse kinematics positioning using nonlinear programming for highly articulated figures"; Jianmin Zhao, Norman I. Badler; vol. 13,Issue 4 (Oct. 1994) pp. 313-336; ISSN:0730-0301.*

"A Computational Framework for Simulating and Analyzing Human and Animal Movement" Scott L Delp et al; IEEE Comoputer Society 2000.*

Endpoint POsition control using biological concepts; Littman & Smith et al; IEEE 1993.*

Motion Capture-Driven Simulations that hit and react; Zordan; ACM 2002.*

New UNICA service uniquely customized 1.5 Terabyte of Motion capture Data; Aug. 10, 1999; http://www.hoise.com/primeur/99/articles/monthly/AE-PR-09-99-40.html.*

Victor Brian Zordan, Jessica K. Hodgins; "Motion capture-driven simulations that hit and react" pp. 89-96; Jul. 2002 SCA '02: Proceedings of the 2002 ACM SIGGRAPH/Eurographics symposium on Computer animation; ISBN:1-58113-573-4.*

Xudong Zhang and Don B. Chaffin "An Inter-Segment Allocation Strategy for Postural Control in Human Reach Motions Revealed by Differential Inverse Kinematics and Optimization" IEEE 1997, pp. 469-474.*

Xingfei Li and Shaojun Xiao; "Model Predictive Control of Human Elbow Joint Movement" IEEE 1998 pp. 2366-2369.*

Ulrich Raschke, et al. *"Control Strategies for Simulating Human Movement,"* Digital Human Modeling for Design and Engineering Conference and Exposition, Dayton, Ohio, Apr. 28-29, 1998; (7 pages total).

L.M. Tanco and A.Hilton, "Realistic Synthesis of Novel Human Movements from a Database of Motion Capture Examples," *Proceedings Workshop on Human Motion IEEE Comput. Soc*, Los Alamitos, CA, XP002309200, ISBN 0-7695-0939-8, pp. 137-142, Dec. 8, 2000.

Miyamoto, et al., "A Kendama Learning Robot Based on Bi-directional Theory", Neural Networks, vol. 9, No. 8, Nov. 1996, pp. 1281-1302.

Chung, et al., "MCML: motion capture markup language for integration of heterogeneous motion capture data", Computer Standards and Interfaces, vol. 26, No. 2, Mar. 2004, pp. 113-130.

PCT Notification of Transmittal of the International Search Report and the Written Opinion of the International Searching Authority, or the Declaration, for International Application No. PCT/US2005/031415, 28 pages, Jun. 1, 2006.

Rodriguez et al.; Approximating Human Reaching Volumes Using Inverse Kinematics; XP-002379612; 3 pages, Dec. 13, 2003.

Rodriguez et al.; Reaching Volumes Generated by Means of Octal Trees and Cartesian Constraints; XP-10646248; 6 pages, Jul. 9, 2003.

Park et al.; Toward Memory-Based Human Motion Simulation: Development and Validation of a Motion Modification Algorithm; XP-2379613; 6 pages, May 3, 2004.

U.S. Appl. No. 10/869,462, filed Jun. 15, 2004, *System and Method for Simulating Human Movement Using Profile Paths*, Ulrich Raschke.

U.S. Appl. No. 10/933,699, filed Sep. 3, 2004, *System and Method for Predicting Human Posture Using a Rules-Based Sequential Approach*, Ulrich Raschke.

H. Miyamoto, et al., *A Kendama Learning Robot Based on Bi-directional Theory*, 1996 Special Issue, Neural Networks, vol. 9, No. 8, pp. 1281-1302, © 1996 Elsevier Science Ltd. (22 pgs).

H-S Chung, et al., *MCML: motion capture markup language for integration of heterogeneous motion capture data*, Computer Standards & Interfaces 26 (2004) 113-130, www.ElsevierComputerScience.com, © 2003 (18 pgs).

J. Lander, Working with Motion Capture File Formats, *Game Developer Magazine*, Jan. 1998, www.gdmg.com (8 pgs).

T. B. Moeslund, et al., *Multiple Cues used in Model-Based Human Motion Capture*, Laboratory of Computer Vision and Media Technology, Institute of Electronic Systems, Denmark (6 pgs).

PCT Notification of Transmittal of the International Search Report and the Written Opinion of the International Searching Authority, or the Declaration, mailed Oct. 26, 2005, corresponding to PCT/US05/022499 filed Jun. 15, 2005 (14 pages).

H-S Chung, et al.,*MCML: motion capture markup language for integration of heterogeneous motion capture data*, Computer Standards & Interfaces 26 (2004) 113-130, www.ElsevierComputerScience.com, © 2003 (18 pgs).

\* cited by examiner

SYSTEM AND METHOD FOR SIMULATING HUMAN MOVEMENT

TECHNICAL FIELD OF THE INVENTION

The present invention relates generally to the computer-aided design ("CAD") industry and, more particularly, to a system and method for simulating human movement.

BACKGROUND OF THE INVENTION

Human movement simulation tools are used for ergonomic analysis of workplaces, products, training and service operations, as well as in the entertainment, industry. The process of accurately representing human movement is tedious, time-consuming, and requires skilled operators adept at manipulating complex 3D kinematic systems at the joint level. Efforts to model human movement using empirical observation of actual people performing tasks is referred to as motion capture technology. Subsequent statistical modeling of these movement data are limited by the form of the data. Both joint angle data over time and landmark data over time datasets are available. However, joint angle data may not be applied to arbitrary skeletal configurations because the angle definitions are dependent on the skeletal configuration. Landmark data require constraint solutions, in which the kinematic human "skeleton" is best fit to the landmark data using mathematical optimization methods, which are slow and inconsistent. Another limitation of the current approach is that these empirical data tend to reflect the experimental conditions under which they were experimentally observed in the lab. For example, always beginning a movement from a "neutral starting posture." In most simulations, however, the ending posture of the previous motion defines the starting posture of the next, so movements from arbitrary start postures are required. Collecting data and developing empirical models for the almost infinite number of tasks and loading conditions of which humans are capable are remote.

Another human movement modeling method utilizes key frame locations, such as in the robotics field. In this method, simple posture transition interpolators drive all joints such that they start moving and end at the same time. This results in a robotic looking motion, which looks unrealistic.

SUMMARY OF THE INVENTION

According to one embodiment of the invention, a computerized method for simulating human movement includes storing a plurality of sets of data, in which each set of data is indicative of a measured movement of a first human, receiving a start point and an end point for a desired movement of a second human, and comparing the desired movement to the stored sets of data. The method further includes selecting, based on the comparison, a stored set of data that is representative of the desired movement and simulating the desired movement based on the start point, the end point, and the relative change in position of a first joint associated with the selected set of data from an empirical start point to an empirical end point.

Embodiments of the invention provide a number of technical advantages. Embodiments of the invention may include all, some, or none of these advantages. In one embodiment, a human movement simulation method captures the complex choreography of human motion to realistically simulate human motion. Based on identification of when particular angles of joints and segments of a skeletal configuration start to move, and at what rate, then simple posture transition methods may be modified to capture the complex choreography of the human motion. In this manner, the start points and end points from stored data sets are disassociated, which makes it easier to simulate human motion. This method may be adapted to any posture in a consistent manner without having to utilize mathematical optimization methods. In addition, any reasonable kinematic skeletal configuration may be simulated, such as a human or other living object. The use of angle profiles to simulate human movement may be adapted to the type of task (i.e., reach one-handed, reach two-handed, lifting, etc.) taking into account all parameters that may affect how humans move, including such factors as age, gender, and size. Embodiments of the present invention may help users that are unskilled in ergonomics and human factors science evaluate human factor concerns throughout all phases of a product engineering cycle.

Other technical advantages are readily apparent to one skilled in the art from the following figures, descriptions, and claims.

BRIEF DESCRIPTION OF THE DRAWINGS

For a more complete understanding of the invention, and for further features and advantages, reference is now made to the following description, taken in conjunction with the accompanying drawings, in which.

DETAILED DESCRIPTION OF EXAMPLE EMBODIMENTS OF THE INVENTION

Example embodiments of the present invention and their advantages are best understood by referring now to FIGS. 1A through 4 of the drawings, in which like numerals refer to like parts.

Figure 1A:
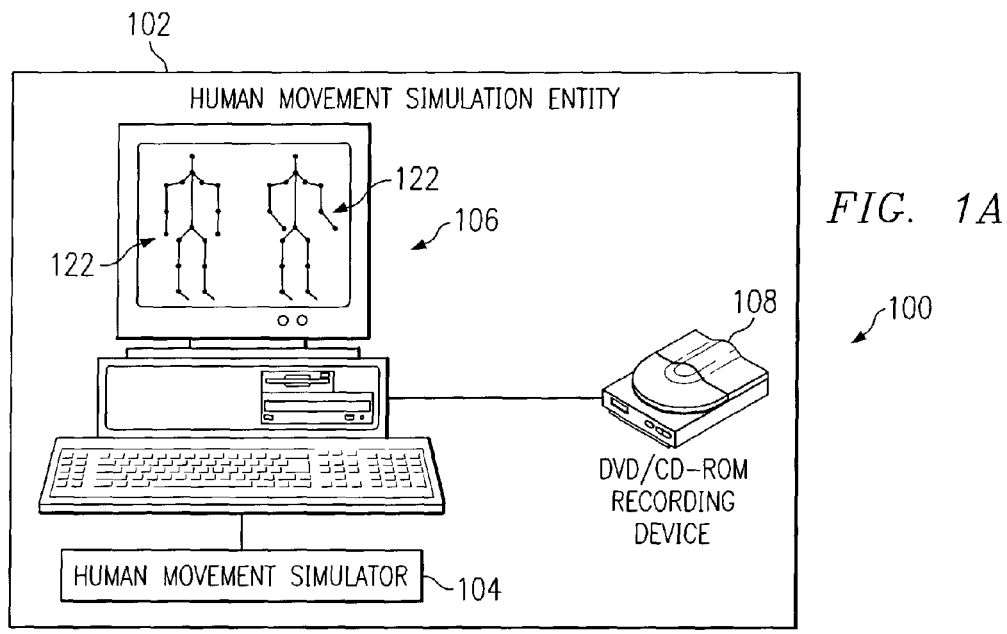
FIG. 1A is a block diagram illustrating a human movement simulation system according to one embodiment of the invention.

FIG. 1A is a block diagram illustrating a human movement simulation system 100 according to one embodiment of the present invention. System 100 includes a human movement simulation entity 102 employing a human movement simulator 104 having access to a computer 106 and a recording device 108. Human movement simulation entity 102 may be any company or other suitable entity that simulates human movement. Human movement simulation entity 102 often has a goal of predicting human movement in an accurate and cost-efficient manner. Because human movement simulation may be a relatively complex and costly process, some embodiments of the present invention provide a computerized method and system that captures the complex choreography of human motion to realistically simulate human motion. This computerized method may be adapted to any posture in a consistent manner without having to utilize such things as mathematical optimization methods. In addition, although simulation of "human" movement is used throughout this detailed description, any reasonable kinematic skeletal configuration may be simulated, such as that of an animal, fish or other suitable living object. This computerized method is utilized by human movement simulator 104, which may be either an individual employee, a group of employees employed by human movement simulation entity 102, or an independent computer program that initiates the method.

Figure 1B:
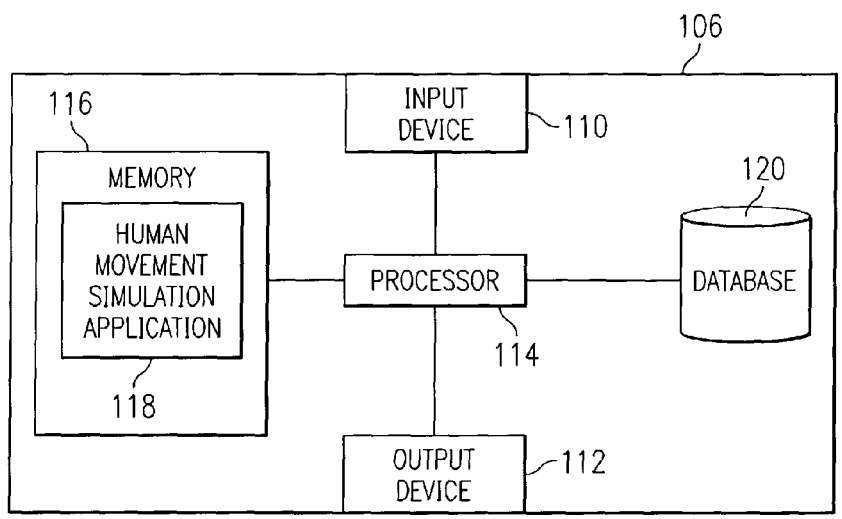
FIG. 1B is a block diagram of a computer in the system of FIG. 1 for use in simulating human movement according to one embodiment of the invention.

FIG. 1B is a block diagram of computer 106 for use in simulating human movement according to one embodiment of the present invention. In the illustrated embodiment, computer 106 includes an input device 110, an output device 112, a processor 114, a memory 116 storing human movement simulation application 118, and a database 120.

Input device 110 is coupled to computer 106 for allowing human movement simulator 104 to utilize human movement simulation application 118. For example, human movement simulator 104 may utilize human movement simulation application 118 through one or more user interfaces contained within human movement simulation application 118. This allows human movement simulator 104 to input, select, and/or manipulate various data and information. In one embodiment, input device 110 is a keyboard; however, input device 110 may take other forms, such as an independent computer program, a mouse, a stylus, a scanner, or any combination thereof.

Output device 112 is any suitable visual display unit, such as a liquid crystal display ("LCD") or cathode ray tube ("CRT") display, that allows human movement simulator 104 to "see" the human movement that he or she is trying to simulate. For example, referring back to FIG. 1A, an example simulation 122 may be seen on output device 112. Output device 112 may also be coupled to recording device 108 for the purpose of recording any desired information, such as a simulation or other suitable information. For example, a simulation may be recorded on a DVD, CD-ROM, or other suitable media. A simulation may also be sent to a file or utilized by another computer program.

Processor 114 comprises any suitable type of processing unit that executes logic. One of the functions of processor 114 is to retrieve human movement simulation application 118 from memory 116 and execute human movement simulation application 118 to allow human movement simulator 104 to simulate human movement. Other functions of human movement simulation application 118 are discussed more fully below in conjunction with FIGS. 2A through 4. Processor 114 may also control the capturing and/or storing of information and other suitable data, such as data indicative of a measured movement of a human.

Human movement simulation application 118 is a computer program written in any suitable computer language. According to the teachings of the present invention, human movement simulation application 118 is operable to utilize data and information stored in database 120 and input by human movement simulator 104 for the purpose of simulating movement of a human. Human movement simulation application 118 may perform other suitable functions, capturing data indicative of a measured movement of a human. Some functions of human movement simulation application 118 are described below in conjunction with FIGS. 2A through 4. In the illustrated embodiment, human movement simulation application 118 is logic encoded in memory 116. However, in alternative embodiments, human movement simulation application 118 is implemented through application specific integrated circuits ("ASICs"), field programmable gate arrays ("FPGAs"), digital signal processors ("DSPs"), or other suitable specific or general purpose processors.

Memory 116 and database 120 may comprise files, stacks, databases, or other suitable organizations of volatile or non-volatile memory. Memory 116 and database 120 may be random-access memory, read-only memory, CD-ROM, removable memory devices, or any other suitable devices that allow storage and/or retrieval of data. Memory 116 and database 120 are interchangeable and may perform the same functions. In the illustrated embodiment, database 120 stores various rules, formulas, tables, and other suitable logic that allows human movement simulation application 118 to perform its function when simulating human movement. Database 120 may also store data associated with the capturing of a measured movement of a human, such as that data captured with the use of motion capture technology.

FIGS. 2A through 3B illustrate the teachings of one embodiment of the present invention. The human movement used to illustrate the teachings of this embodiment is a human simply raising a portion of his or her arm from some starting position to some ending position.

Figure 2A:
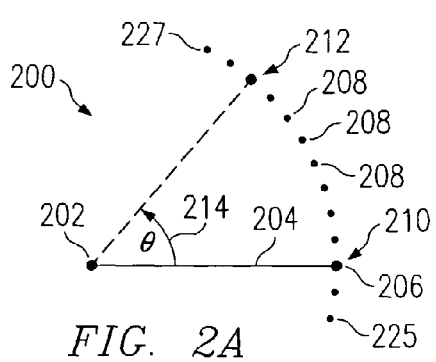
FIG. 2A illustrates a empirical model of a portion of a human's arm in which the portion is raised approximately 60 degrees.

Referring to FIG. 2A, an empirical model 200 of a portion of a human's arm in which the portion is raised approximately 60 degrees is illustrated. Empirical model 200 includes a joint 202, a segment 204, and an end effector 206. End effector 206 may also represent a joint in some embodiments, depending on empirical model 200. Generally, end effectors represent an end of a segment (e.g., a tip of a human's finger) and joints connect segments. A plurality of points 208 illustrate various positions of end effector 206 during the movement of end effector 206 from a start position 210 to an end position 212. Data associated with empirical model 200 may be captured using any suitable method; however, in one embodiment motion capture technology is utilized. Any suitable data may be captured, such as positional data for joint 202 and end effector 206 and rotational data with respect to joint 202. In addition, the positional and rotational data may be captured with respect to time during a time period it takes for end effector 206 to move from start position 210 to end position 212. In the illustrated embodiment, an angle 214 measures the rotation of joint 202. In other words, angle 214 measures the position of segment 204 with respect to a horizontal axis of a Cartesian coordinate system. However, angle 214 may be with respect to any suitable reference plane. For example, although not shown, another segment of a portion of the human's arm may be coupled to joint 202 and the angular position of segment 204 may be with respect to the plane that that segment lies in.

Figure 2B:
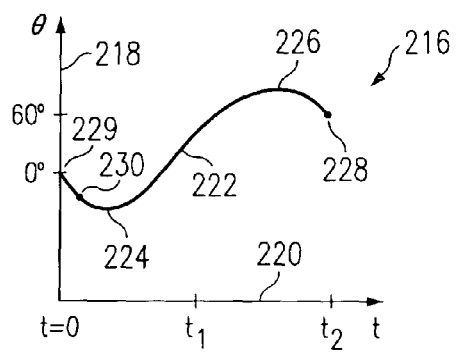
FIG. 2B is a graph illustrating empirical data of the relative change in angle of the portion of the arm of FIG. 2A with respect to some starting position.

Some data captured from empirical model 200 is illustrated in FIG. 2B. This is one example of the type of data that may be stored in database 120 (FIG. 1B). FIG. 2B is a graph 216 illustrating rotational data of joint 202 with respect to a reference plane over the time period it takes for end effector 206 to move from start position 210 to end position 212. As illustrated in FIG. 2B, a Y-axis 218 represents angle 214 and an X-axis 220 represents time. A curve 222 represents the rotation of joint 202 during the time period. As illustrated, joint 202 starts at an angle of zero degrees at time zero. Instead of a straight line interpolation in which end effector 206 moves from start position 210 to end position 212, joint 202 actually rotates in a negative direction when the movement first starts. Joint 202 reaches its maximum negative rotation at some point in time, as denoted by a point 224 on curve 222. Point 224 coincides with a point 225 as shown in FIG. 2A. The rotation of joint 202 then starts to positively rotate until it reaches its maximum rotation at some later point in time, as denoted by point 226 on curve 222. Point 226 corresponds to a point 227 as illustrated in FIG. 2A. Joint 202 then starts decreasing in rotation until reaching its final rotation, as denoted by point 228 on curve 222. Point 228 corresponds with end position 212 of end effector 206, as illustrated in FIG. 2A.

In previous systems of simulating human movement, a straight line interpolation is made of end effector 206 from start position 210 to end position 212. As a result, the simulation starts end effector 206 upward at time zero towards end position 212 such that it traverses the same angular displacement per unit time. Simulating all joints and segments of a skeletal configuration this way makes for a robotic-looking motion, which is unnatural. Curve 222 as illustrated in FIG. 2B illustrates that actual rotation of a joint when the human is raising a portion of his or her arm may be much different than a straight line interpolation. In fact, although not illustrated, joint 202 could actually not start to rotate until it reached a time t1, as illustrated in FIG. 2B, and then start to positively rotate towards its maximum rotation, as denoted by point 226. Generally, the teachings of one embodiment of the present invention seek to capture the angular profile of various joints and segments within a skeletal configuration and utilize these angular profiles to simulate a desired human movement in a realistic and cost-efficient manner. The desired human movement in the example being discussed is illustrated in FIGS. 3A and 3B.

Figure 3A:
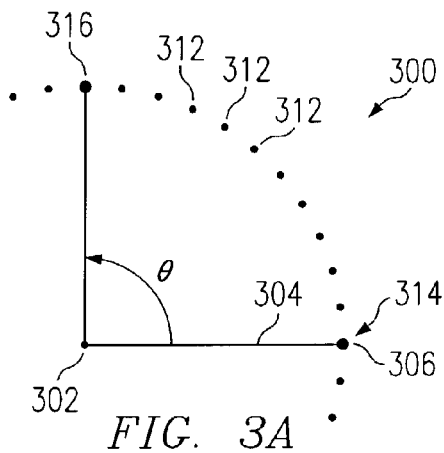
FIG. 3A illustrates a desired simulation of a portion of a human's arm in which the portion is raised approximately 90 degrees.
Figure 3B:
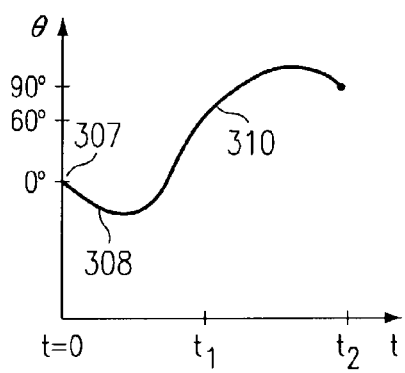
FIG. 3B is a graph illustrating applying the angular information from FIG. 2B onto a straight line interpolation of the change in angle of the portion of the arm of FIG. 3A with respect to some starting position.

FIG. 3A illustrates a desired simulation 300 of a portion of a human's arm in which the portion is raised approximately 90 degrees. The teachings of one embodiment of the present invention seek to utilize the information contained in FIGS. 2A and 2B to simulate the raising of the portion of the human's arm as illustrated in FIG. 3A. Desired simulation 300 includes a joint 302, a segment 304, and an end effector 306. End effector 306 may also represent a joint in some embodiments. To simulate the movement shown in FIG. 3A, data representing a similar type of movement that has been measured must be selected. Human movement simulator 104 (FIG. 1A) may select the appropriate empirical model 200 using output device 112 or human movement simulation application 118 may perform this step automatically via any suitable comparison algorithm. Once an empirical model 200 is selected that is representative of desired simulation 300, then the data related to empirical model 200 may be utilized to simulate the movement shown in FIG. 3A. To simulate the movement, the data associated with empirical model 200 must be utilized to predict the rotation of joint 302. Since the data contained in FIG. 2B is available, the rotation of joint 302 may be predicted with accuracy in a cost effective manner, as described below.

The data associated with empirical model 200 is utilized in the following manner. It is known from this data the amount of rotation of joint 202 as end effector 206 moves from one point 208 to the next point 208 as it travels its path from start position 210 to end position 212. For example, when joint 202 first starts to rotate, it starts out at zero degrees rotation, as represented by reference numeral 229 in FIG. 2B. At a certain time later joint 202 is at a rotation represented by reference numeral 230, which is some negative rotation. The difference between the rotation at point 229 and at point 230 is known to be a certain percentage of the overall rotation of joint 202 from end effector's 206 start position 210 to end position 212. This relative change may then be applied to joint 302 of FIG. 3A to predict what joint 302 will do when it first starts its rotation.

For example, if the relative rotational change of joint 202 from point 229 to point 230 (FIG. 2B) is −33% during the first 10% of the duration of its rotation, then the relative angular change of joint 302 from point 307 to point 308 (FIG. 3B) will be −33% during the first 10% of the duration of its rotation. Hence, if the total change in rotation of joint 302 is 90 degrees, and −33% of that is approximately −30 degrees, then point 308 on curve 310 in FIG. 3B will be at approximately −30 degrees. The relative change in rotation of joint 202, as end effector 206 moves from each point 208 to the next point 208 of empirical model 200, is applied in a similar manner to joint 302, as end effector 306 moves between a plurality of points, as represented by reference numeral 312. As can be seen comparing FIGS. 2B and 3B a similar looking curve is obtained. In other words, curve 222 is "superimposed" on a straight line interpolation of joint 302 from end effector's 306 start position 314 to end position 316.

Even though the portion of the human's arm is travelling from 0 to 90 degrees for desired simulation 300 in FIG. 3A, and the portion of the human's arm is travelling from 0 to 60 degrees for empirical model 200 in FIG. 2A, it is a similar movement (i.e., raising of the arm) and thus may be used to simulate the 0 degree to 90 degree movement. All joints and segments of any suitable skeletal configuration may be simulated in a similar manner as described above.

Figure 4:
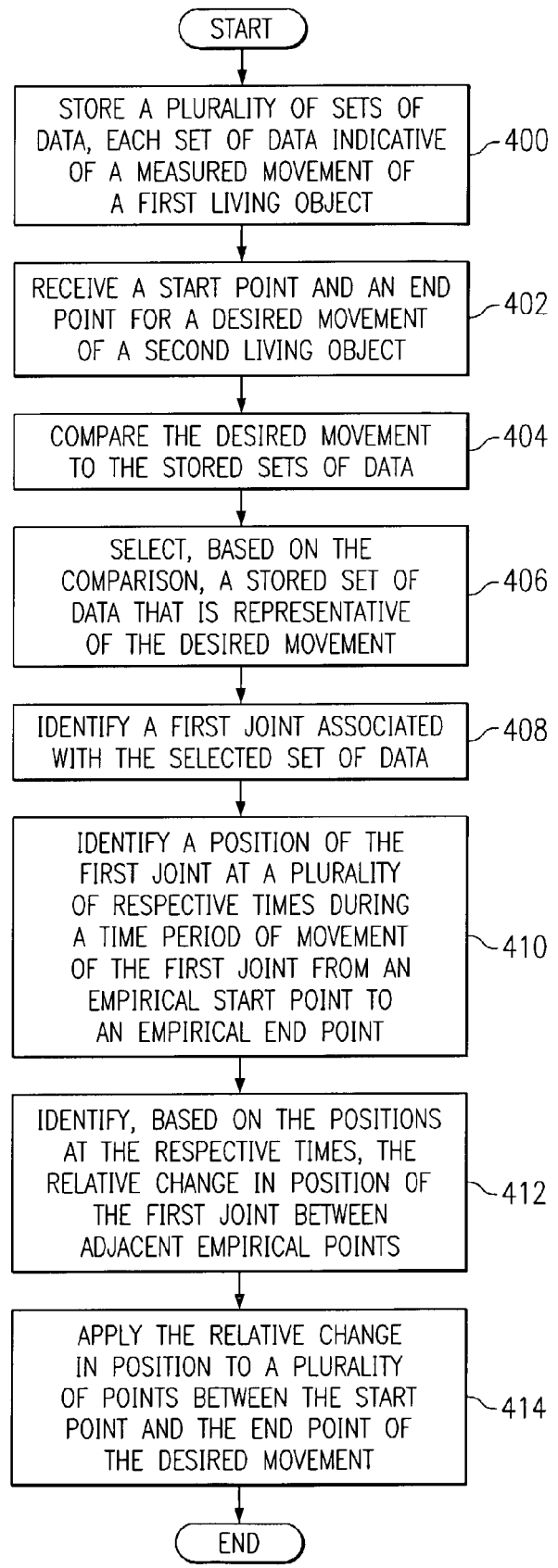
FIG. 4 is a flowchart illustrating a computerized method of simulating human movement according to one embodiment of the invention.

FIG. 4 is a flowchart illustrating a computerized method of simulating movement of a living object according to one embodiment of the present invention. The method begins at step 400 where a plurality of sets of data are stored. These sets of data may be stored in database 120 (FIG. 1B). Each set of data is indicative of a measured movement of a skeletal configuration of a living object, such as a human. These sets of data may be obtained using any suitable method, such as motion capture technology. The data stored may be any suitable data, such as positional data, angular data, velocity data, time data, or other suitable data. At step 402, a start point 314 (FIG. 3A) and an end point 316 for a simulation of a desired movement of a living object is received. The desired movement is then compared to the stored sets of data in database 120 at step 404.

Based on the comparison at step 404, a stored set of data that is representative of the desired movement is selected at step 406. This may be done by human movement simulator 104 using input device 110 and output device 112, in which human movement simulator 104 may select from a plurality of stored movements. Or, human movement simulation application 118 may do this automatically using any suitable algorithm. At step 408, a first joint associated with the selected set of data is identified. A position of this first joint is identified, at step 410, at a plurality of respective times during a time period of movement of the first joint from an empirical start point to an empirical end point. The relative change in position (i.e., the relative rotation) of the first joint between adjacent empirical points is identified, based on the positions at the respective times, at step 412. Then, the relative change in position may be applied, at step 414, to a plurality of points between the start point and the end point of the desired movement to simulate the movement. This concludes one method of simulating movement of a living object according to one embodiment of the present invention.

Although embodiments of the invention and their advantages are described in detail, a person skilled in the art could make various alterations, additions, and omissions without departing from the spirit and scope of the present invention as defined by the appended claims.

What is claimed is:

1. A computerized method for simulating movement of a physical object, the method performed by logic encoded in one or more non-transitory tangible media when executed by a computer, the method comprising:

storing a plurality of sets of data in a tangible memory, each set of data indicative of a measured movement of a first physical object having a first joint, each set of data describing an empirical overall change from an empirical start point to an empirical end point, each set of data recording an empirical curve of an empirical angular profile, the empirical angular profile comprising a first axis representing an angle and a second axis representing time, the empirical curve representing movement of the first joint through the angle with respect to time;

storing a desired start point and a desired end point of a desired overall change for a desired movement of a second joint of a second joint of a second physical object in the memory, the first physical object different from the second physical object, the second joint comparable to the first joint, the empirical overall change different from the desired overall change;

comparing the desired movement to the sets of data;

selecting, based on the comparison, a set of data that is representative of the desired movement of the second joint to yield a selected set of data;

superimposing the empirical curve on the desired movement of the second joint from the desired start point to the desired end point in order to:

determine a first change in angular position of the first joint of the first physical object associated with the selected set of data, the first change in angular position defining angular rotation of the first joint about an axis through the first joint;

determine a percentage representing a fraction of the first change over the empirical overall change of the selected set of data;

determine a second change in angular position of a second joint based on the percentage and the desired overall change between the desired start point to the desired end point, the second change determined from the percentage of the desired overall change; and displaying a simulation of the desired movement of the second physical object on a tangible output device in accordance with the established second change.

2. The computerized method of claim 1, wherein the outputting step comprises:

identifying the first joint associated with the selected set of data;

identifying in the selected set of data, a plurality of empirical positions of the first joint at a plurality of respective times during a time period of movement of the first joint from the empirical start point to the empirical end point;

determining, for each empirical position, the first change in angular position of the first joint between adjacent empirical positions;

establishing, for each empirical position, the second change in angular position of the second joint between the start point and the end point that is proportional to the first change in angular position of the first joint between adjacent empirical positions; and applying the second change in angular position to a plurality of points of the second joint to simulate the desired movement of the second physical object.

3. The computerized method of claim 2, further comprising dividing the time period into approximately equal times.

4. The computerized method of claim 2, wherein determining, for each empirical position, the first change in angular position comprises identifying a first change in angle of a segment associated with the first joint relative to a reference plane as the first joint moves between adjacent empirical positions.

5. The computerized method of claim 4, further comprising associating the reference plane with a fixed cartesian coordinate system.

6. The computerized method of claim 4, further comprising associating the reference plane with a plane that corresponds to an axis of an adjacent segment.

7. The computerized method of claim 1, wherein the outputting step comprises:

identifying the first joint associated with the selected set of data;

identifying a plurality of empirical points in the selected set of data corresponding to respective angular positions of the first joint during a time period of the first joint moving from the empirical start point to the empirical end point;

identifying, for each of the plurality of empirical positions, a ratio of the change in angular position from one empirical point to the next empirical point to the overall change in angular position from the empirical start point to the empirical end point during the time period; and determining a plurality of points between the start point and the end point associated with the identified ratios to simulate the desired movement.

8. The computerized method of claim 1, wherein the physical object is a human.

9. One or more non-transitory computer readable tangible media encoded with logic configured to simulate movement of a physical object, the logic, when executed by a computer, operable to perform the following steps:

store a plurality of sets of data in a tangible memory, each set of data indicative of a measured movement of a first physical object having a first joint, each set of data describing an empirical overall change from an empirical start point to an empirical end point, each set of data recording an empirical curve of an empirical angular profile, the empirical angular profile comprising a first axis representing an angle and a second axis representing time, the empirical curve representing movement of the first joint through the angle with respect to time;

store a desired start point and a desired end point of a desired overall change for a desired movement of a second joint of a second physical object in the memory, the first physical object different from the second physical object, the second joint comparable to the first joint, the empirical overall change different from the desired overall change;

compare the desired movement to the sets of data;

select, based on the comparison, a set of data that is representative of the desired movement of the second joint to yield a selected set of data, the selected set of data having a plurality of empirical points comprising an empirical start point and an empirical end point;

superimpose the empirical curve on the desired movement of the second joint from the desired start point to the desired end point in order to:

identify the first joint of the first physical object associated with the selected set of data;

identify in the selected set of data, a plurality of first changes in angular positions of the first joint at a plurality of respective times during a time period of movement of the first joint from an empirical start point to an empirical end point, the plurality of first changes in the angular positions of the first joint defining angular rotation of the first joint about an axis through the first joint;

determine a plurality of percentages, a percentage representing a fraction of a first change over the empirical overall change of the selected set of data;

determine, for each respective time a second change in angular position of the second joint based on the plurality of percentages and the desired overall change between the desired start point and the desired end point, the second change determined from the percentage of the desired overall change;

apply, for each respective time, the second change in angular position to a point between the desired start point and the desired end point of the desired movement; and display a simulation of the desired overall change of the second physical object on a tangible output device in accordance with the second change.

10. The computer readable tangible media of claim 9, wherein the logic is further operable to divide the time period into approximately equal times.

11. The computer readable tangible media of claim 9, wherein the logic is further operable to identify a change in angle of a segment associated with the first joint relative to a reference plane as the first joint moves between adjacent empirical points.

12. The computer readable tangible media of claim 11, wherein the logic is further operable to associate the reference plane with a fixed cartesian coordinate system.

13. The computer readable tangible media of claim 11, wherein the logic is further operable to associate the reference plane with a plane that corresponds to an axis of an adjacent segment.

14. The computer readable tangible media of claim 9, wherein the physical object is a human.

15. A computerized method for simulating movement of a physical object, the method performed by logic encoded in one or more non-transitory tangible media when executed by a computer, the method comprising:

storing a plurality of sets of data in a tangible memory, each set of data indicative of a measured movement of a first physical object having a first joint, each set of data describing an empirical overall change from an empirical start point to an empirical end point, each set of data recording an empirical curve of an empirical angular profile, the empirical angular profile comprising a first axis representing an angle and a second axis representing time, the empirical curve representing movement of the first joint through the angle with respect to time;

storing a desired start point and a desired end point of a desired overall change for a desired movement of a second joint of a second physical object in the memory, the first physical object different from the second physical object, the second joint comparable to the first joint, the empirical overall change different from the desired overall change;

comparing the desired movement to the sets of data;

selecting, based on the comparison, a set of data that is representative of the desired movement of the second joint to yield a selected set of data, the selected set of data having a plurality of empirical points comprising an empirical start point and an empirical end point;

identifying the first joint of the first physical object associated with the selected set of data;

superimposing the empirical curve on the desired movement of the second joint from the desired start point to the desired end point in order to:

identify in the selected set of data, a plurality of first changes in angular positions of the first joint at a plurality of respective times during a time period of movement of the first joint from the empirical start point to the empirical end point, the plurality of first changes in angular positions of the first joint defining angular rotation of the first joint about an axis through the first joint;

determine a plurality of percentages, a percentage representing a fraction of a first change over the empirical overall change of the selected set of data;

determine, for each respective time a second change in angular position of the second joint based on the plurality of percentages and the desired overall change between the desired start point and the desired end point, the second change determined from the percentage of the desired overall change; and displaying a simulation on a tangible output device by displaying, for each respective time, a point between the desired start point and the desired end point of the desired movement of the second physical object in accordance with the determined second change.

16. The computerized method of claim 15, further comprising dividing the time period into approximately equal times.

17. The computerized method of claim 15, wherein identifying a plurality of first changes comprises identifying a change in angle of a segment associated with the first joint relative to a reference plane as the first joint moves between adjacent empirical points.

18. The computerized method of claim 17, further comprising associating the reference plane with a fixed cartesian coordinate system.

19. The computerized method of claim 17, further comprising associating the reference plane with a plane that corresponds to an axis of an adjacent segment.

20. The computerized method of claim 15, wherein the physical object is a human.

21. A computerized method for simulating movement of a physical object, the method performed by logic encoded in one or more non-transitory tangible media when executed by a computer, the method comprising:

storing a plurality of sets of data in a tangible memory, each set of data indicative of a measured movement of a first physical object having a first joint, each set of data describing an empirical overall change from an empirical start point to an empirical end point, each set of data recording an empirical curve of an empirical angular profile, the empirical angular profile comprising a first axis representing an angle and a second axis representing time, the empirical curve representing movement of the first joint through the angle with respect to time;

storing a desired start point and a desired end point of a desired overall change for a desired movement of a second joint of a second physical object in the memory, the first physical object different from the second physical object, the second joint comparable to the first joint, the empirical overall change different from the desired overall change;

comparing the desired movement to the sets of data;

selecting, based on the comparison, a set of data that is representative of the desired movement of the second joint to yield a selected set of data;

superimposing the empirical curve on the desired movement of the second joint from the desired start point to the desired end point in order to:
- determine a first change in position of the first joint of the first physical object associated with the selected set of data;
- determine a percentage representing a fraction of the first change over the empirical overall change of the selected set of data;
- determine a second change in position of the second joint based on the percentage and the desired overall change between the desired start point and the desired end point, the second change determined from the percentage of the desired overall change; and displaying a simulation of the desired movement of the second physical object on a tangible output device in accordance with the established second change.

22. The computerized method of claim 1, wherein determining a second change in position of the second joint comprises:

determining a first angular change of the first joint about a first axis through the first joint, the first rotation from the empirical start point to the empirical end point;

determining a second angular change of the second joint about a second axis through the second joint based on the percentage and the desired overall change between the desired start point and the desired end point; and establishing a second change in position based on the second angular change.

* * * * *